United States Patent [19]

Obinata

[11] Patent Number: 5,753,090
[45] Date of Patent: May 19, 1998

[54] SMALL SIZE SPUTTERING TARGET AND HIGH VACUUM SPUTTERING APPARATUS USING THE SAME

[75] Inventor: Hisaharu Obinata, Shizuoka-ken, Japan

[73] Assignee: Nihon Shinku Gijutsu Kabushiki Kaisha, Kanagawa-Ken, Japan

[21] Appl. No.: 679,219

[22] Filed: Jul. 12, 1996

[30] Foreign Application Priority Data

Jul. 14, 1995 [JP] Japan .................................. 7-178822

[51] Int. Cl.$^6$ .................................................. C23C 14/34
[52] U.S. Cl. .................. 204/298.12; 204/192.12; 204/298.2
[58] Field of Search ................ 204/298.12, 192.12, 204/298.2

[56] References Cited

FOREIGN PATENT DOCUMENTS

| 150482 | 9/1981 | Germany | 204/298.12 |
|---|---|---|---|
| 239807 | 10/1986 | Germany | 204/298.12 |
| 63-153266 | 6/1988 | Japan | 204/298.12 |
| 3-28369 | 2/1991 | Japan | 204/298.12 |
| 3-138361 | 6/1991 | Japan | 204/298.12 |

*Primary Examiner*—Aaron Weisstuch
*Attorney, Agent, or Firm*—Larson & Taylor

[57] ABSTRACT

A high vacuum sputtering apparatus comprising a vacuum chamber in which a substrate to be processed and a small size sputtering target having an outer diameter less than one and a half times the diameter of the substrate and an area inclined toward the outer periphery thereof on the surface disposed opposite to the substrate are oppositely disposed, and the internal pressure of the vacuum chamber is maintained at less than $1 \times 10^{-3}$ Torr for sputtering, thereby obtaining an improved distribution of film thickness and an enhanced coverage symmetry for sputtering.

1 Claim, 3 Drawing Sheets

SMALL SIZE SPUTTERING TARGET AND HIGH VACUUM SPUTTERING APPARATUS USING THE SAME

BACKGROUND OF THE INVENTION

The present invention relates to a small size sputtering target and a high vacuum sputtering apparatus using such a sputtering target.

The technological advantages of sputtering for forming a thin film include an extensive applicability in terms of materials that can be used for the thin film, the homogeneity and uniformity of the produced film, the relative ease with which a thin film of an alloy or chemical compounds is formed, good adhesion of the produced film on a substrate, controllability, responsiveness and reproducibility of operation, and adaptability to prolonged film forming operations. In an attempt to exploit these advantages, there have been proposed various sputtering techniques, of which radio frequency sputtering and magnetron sputtering that utilize the phenomenon of magnetron discharge where an electric field perpendicularly intersects a magnetic field are commonly being used.

In the trend of processing ever larger substrates, sputtering apparatuses are required to handle large targets and cathodes. If the substrate to be processed is a wafer with a diameter of $\phi$ 200 mm, the corresponding target typically has a diameter of $\phi$ 350 mm. If this trend goes further to process wafers with a diameter of $\phi$ 300 mm, targets having a diameter as large as $\phi$ 525 mm will have to be used. Then, such a large target may be too heavy to be handled or simply cannot be manufactured, depending on the material to be used for the target. Even if it can, the cost may be prohibitive.

On the other hand, the distribution of film thickness obtained by sputtering may vary depending on the distribution of angles with which particles are sputtered from the target and collisions that may take place between sputtered particles and gas molecules in the sputtering apparatus. It is known that the distribution of directions with which particles are sputtered from the target usually shows a cosine curve relative to a line normal to the surface of the target, so that a uniform distribution of film thickness can be achieved only in an area smaller than the diameter of the target.

It is also known that the distribution of film thickness changes remarkably as a function of the distance between the target and the substrate.

In recent years, sputtering is used for forming a thin film in contact holes having a high aspect ratio. Referring to FIGS. 1A and 1B of the accompanying drawings, if a target A has a smooth surface as shown in FIG. 1A, in a contact hole(s) located close to the outer periphery of a substrate B, more sputtered particles may come from areas b, c, and d than from area a of the target A. As a result, the film formed in the contact hole is asymmetric both on the bottom and on the lateral wall as shown in FIG. 1B. To minimize or overcome this problem, sputtered particles have to be made to strike the substrate at an angle close to a right angle as much as possible in order to increase the bottom coverage in each of the contact holes on the entire surface of the substrate.

Techniques developed for this purpose include the one called collimated sputtering in which a slit collimator is arranged between the target and the substrate and the so-called long distance sputtering technique providing a large gap between the target and the substrate so that only those sputtered particles that are directed perpendicularly relative to the surface of the substrate are allowed to strike the latter.

However, the former technique involves problems such as film adhering to the slit collimator, separation of the adherent film and a short service life of collimator, and both techniques have to function with a large target whenever a large substrate is processed.

In view of the above identified problems, there has been proposed a novel sputtering target that can control the directions along which particles are sputtered from it by controlling the profile of the surface of the target to improve the uniformity of thickness of the produced film (see Japanese Patent Publication No. 7-15144).

However, the mean free path $\lambda$ (cm) of atoms (molecules) of gaseous substances is about $10^{-2}/p(\text{Torr})$ and the pressure under which the sputtering operation is conducted is about 2 to $5 \times 10^{-3}$ Torr to make $\lambda$ equal to about 2 to 5 cm. On the other hand, the target is separated from the substrate to be processed typically by about 6 to 8 cm but a longer distance must be provided between them for the so-called long distance sputtering. In other words, most of the sputtered particles collide with gas atoms at least once before they reach the substrate.

Therefore, with a target designed to control the directions along which particles are sputtered, most of the particles sputtered from it change their directions after colliding with gas atoms and thus an improvement of distribution of film thickness and coverage symmetry of the film formed in contact holes cannot be substantially achieved.

It is therefore the object of the present invention to provide a small size sputtering target that can achieve an even distribution of film thickness and produce a symmetrically arranged film in the contact holes of a large substrate.

Another object of the invention is to provide a high vacuum sputtering apparatus that uses such a target.

SUMMARY OF THE INVENTION

According to an aspect of the invention, the above first object is achieved by providing a small size sputtering target wherein it has an outer diameter less than one and a half times the diameter of a substrate to be processed and an area inclined toward the outer periphery thereof on the surface disposed opposite to the substrate.

Preferably, the area on the surface inclined toward the outer periphery may be located at the center of the surface.

According to another aspect of the invention, the above second object is achieved by providing a high vacuum sputtering apparatus comprising a vacuum chamber wherein a substrate to be processed and a small size sputtering target having an outer diameter less than one and a half times of the diameter of the substrate to be processed and an area inclined toward the outer periphery thereof on the surface disposed opposite to the substrate are oppositely disposed therein and the internal pressure of the vacuum chamber is maintained at less than $1 \times 10^{-3}$ Torr for sputtering.

Now, the present invention will be described in more detail with reference to the accompanying drawings that illustrate preferred embodiments of the invention.

DETAILED DESCRIPTION OF THE PREFERRED EMBODIMENTS

Figure 1A:
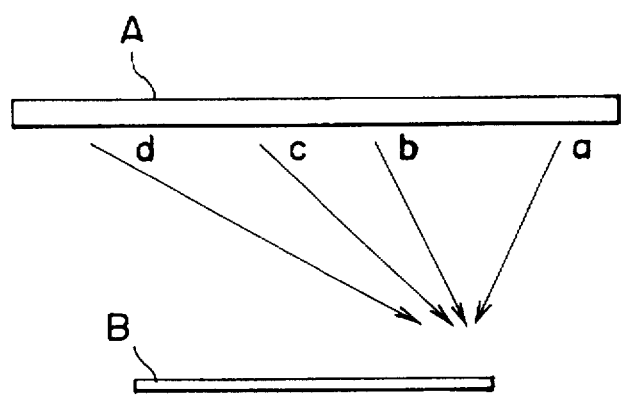
FIG. 1A is a schematic view showing a known flat panel type target and a substrate which are disposed to be oposite to each other.
Figure 1B:
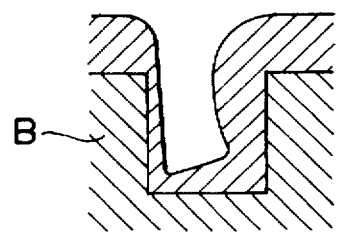
FIG. 1B is an enlarged partial section view of the substrate of FIG. 1A, showing a fine hole arranged in an outer peripheral area of the substrate and the film formed in the hole.
Figure 2A:
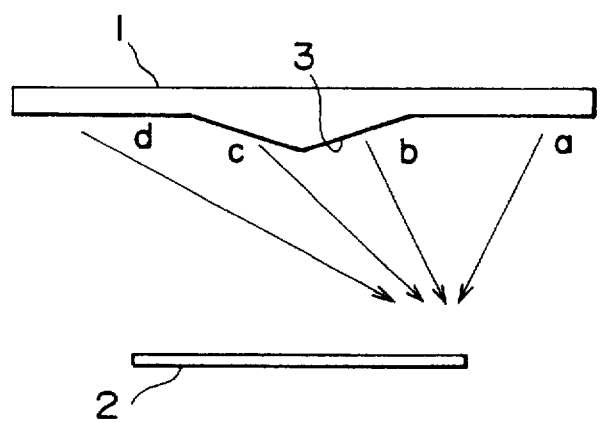
FIG. 2A is a schematic view showing a preferred embodiment of target according to the invention and a substrate which are disposed to be oposite to each other.

Refereing to FIG. 2A there is illustrated one embodiment of a target according to the invention. The target 1 has a circular profile and its surface disposed opposite to the substrate 2 to be processed has a central raised section with an inclined surface 3 sloping down toward the outer periphery. The target 1 has a diameter less than one and a half times that of the substrate 2 to be processed. For example, if the substrate 2 has a diameter of $\phi$ 200 mm, the target 1 may be formed to have a diameter smaller than $\phi$ 300 mm. If the substrate 2 has a diameter of $\phi$ 300 mm, the target 1 may be formed to have a diameter smaller than $\phi$ 450 mm. The angle of slope of the inclined surface 3 of the target 1 is selected appropriately depending on the size of the target 1 and the distance separating the target 1 and the substrate 2 to be processed.

Figure 2B:
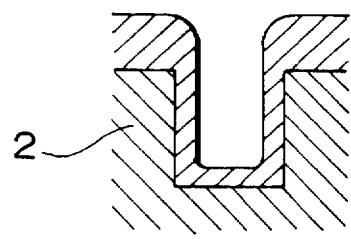
FIG. 2B is an enlarged partial section view of the substrate of FIG. 2A, showing a fine hole or pore arranged in an outer peripheral area of the substrate and the film formed in the hole.

With the target 1 having a configuration as described above, a fine hole or pore provided close to the outer periphery of the substrate 2 is less exposed to particles sputtered from area c of the inclined surface 3 and, additionally, it is also less exposed to particles coming from area d because the area d and the fine hole are separated from each other by a long distance. Thus, consequently, a uniform film is formed on the bottom and the lateral wall of the hole of the substrate 2 mainly by particles coming from areas a and b as illustrated in the enlarged view of FIG. 2B.

Figure 3:
FIG. 3 is a schematic view showing another preferred embodiment of a target according to the invention.

Referring to FIG. 3 there is illustrated another preferred embodiment of target according to the invention in which the inclined surface 3 is extended over the entire surface of the target 1. In other words, the surface of the target 1 is inclined from the center all the way to the outer periphery with a given angle of inclination.

Figure 4:
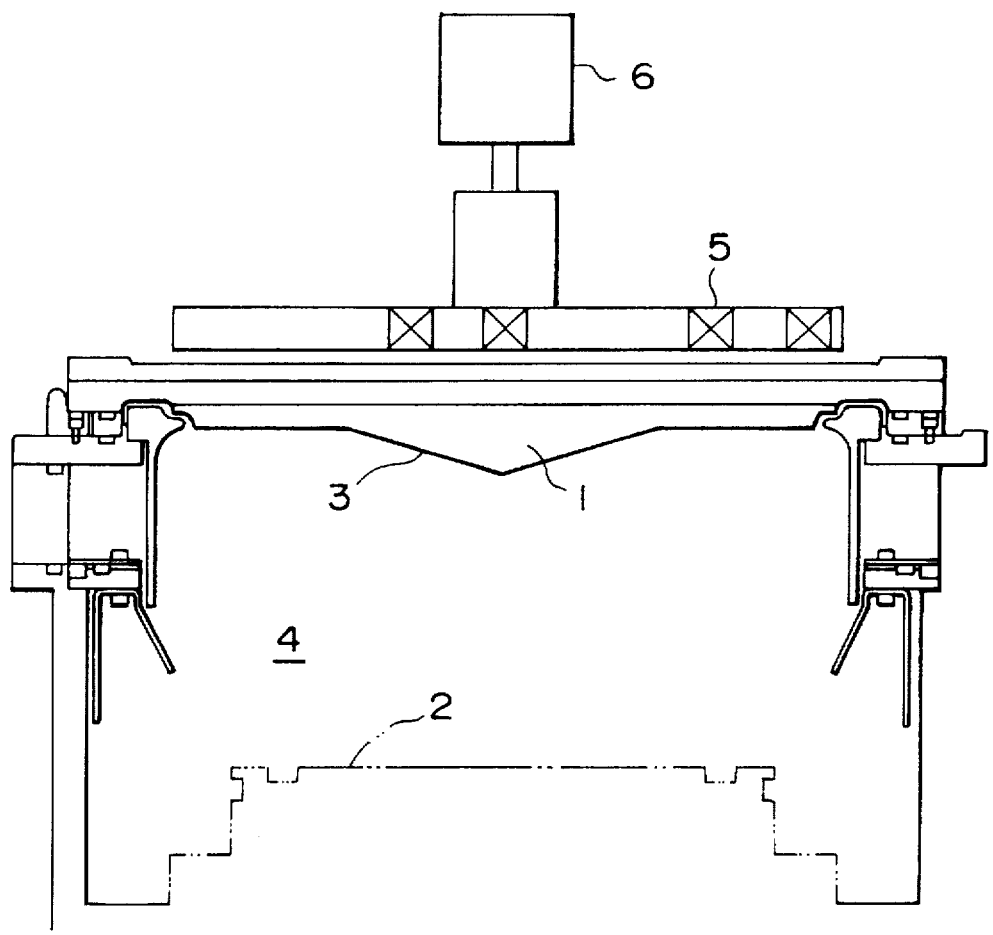
FIG. 4 is a schematic diagram showing a high vacuum magnetron sputtering apparatus using a target according to the invention.
Figure 5:
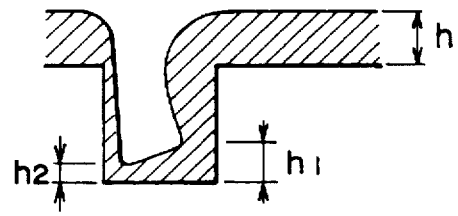
FIG. 5 is an enlarged schematic section view of a fine hole arranged in a substrate, illustrating how a film is formed therein.

FIG. 4 illustrates schematically an embodiment of a high vacuum magnetron sputtering apparatus using the target 1 as shown in FIG. 2A. In FIG. 4, reference numeral 4 denotes a vacuum chamber in which the target 1 and the substrate 2 to be processed are disposed opposite to each other. The internal pressure of the vacuum chamber 4 is held lower than $1 \times 10^{-3}$ Torr in order to minimize the probability of collision of particles sputtered from the target 1 in the vacuum chamber and gas atoms before the former reach the substrate 2. Under such high vacuum condition, the mean free path of gas atoms (molecules) $\lambda$ exceeds 10 cm so that most of the particles sputtered from the target 1 may arrive the substrate 2 without colliding with any gas atom or molecule.

Thus, by keeping the internal pressure of the vacuum chamber 4 containing a target 1 and a substrate 2 to be processed at a high vacuum level, particles sputtered from the target 1 in a controlled manner can directly reach the substrate 2 without changing their respective directions on the way.

A rotable magnet 5 is arranged outside the vacuum chamber 4 on the side facing the rear surface of the target 1 and rotated by a motor 6 in order to obtain erosion of the entire surface of the target 1.

While one of the above described embodiments of the target has a raised central area and is flat in the remaining areas and the entire surface of other embodiment is inclined, a target according to the invention may have a profile different from these embodiments.

For instance, it may have a profile with a surface inclined downward from the outer periphery toward the center.

Examples of the present invention will be now described.

A target having a raised central area as shown in FIG. 2A and a diameter of $\phi$ 200 mm, and a substrate with a diameter of $\phi$ 200 mm were arranged in a vacuum chamber with a distance of 80 mm separating them from each other and the distribution of film thickness of the film formed on the substrate was observed for various internal pressure levels. The result is shown below with the result obtained for a conventional flat target.

| Internal pressure of vacuum chamber | Distribution of film thickness in case of flat target | Distribution of film thickness in the present invention |
| --- | --- | --- |
| $5 \times 10^{-3}$ Torr | ±25% | ±25% |
| $2 \times 10^{-3}$ Torr | ±24% | ±23% |
| $1 \times 10^{-3}$ Torr | ±20% | ±15% |
| $5 \times 10^{-3}$ Torr | ±20% | ±10% |

A target having a raised central area or section as shown in FIG. 2A and a diameter of $\phi$ 200 mm and a substrate with a diameter of $\phi$ 200 mm were arranged in a vacuum chamber with a distance of 80 mm separating them from each other and the bottom coverage and symmetry of the formed film in each fine hole were observed for various internal pressure levels. The result is shown below with the result obtained for a conventional flat target.

| Internal pressure of vacuum chamber | Flat target | | Target of the present invention | |
| --- | --- | --- | --- | --- |
| | h2/h1 | h2 + h1/2h | h2/h1 | h2 + h1/2h |
| $5 \times 10^{-3}$ Torr | Unmeasurably small | <0.1 | Unmeasurably small | <0.1 |
| $2 \times 10^{-3}$ Torr | 1.5 | 0.15 | 1.5 | 0.2 |
| $1 \times 10^{-3}$ Torr | 1.7 | 0.3 | 1.4 | 0.35 |
| $5 \times 10^{-4}$ Torr | 1.9 | 0.55 | 1.3 | 0.6 |

From the above, it is seen that a good coverage ratio (h2+h1/2h) and a good symmetry close to 1.0 were obtained by combining a high vacuum of less than $1 \times 10^{-3}$ Torr and a target according to the invention.

As described above in detail, since a target according to the present invention has a diameter less than one and a half times of that of a substrate to be processed and a surface area inclined downward toward the outer periphery, particles sputtered therefrom can be controlled for the directions along which they leave the surface of the target so that the target can accommodate a large substrate.

A good distribution of film thickness and a good symmetry can be achieved for film formed on a substrate by combining the target according to the invention and the high vacuum sputtering apparatus.

I claim:

1. A high vacuum sputtering apparatus comprising a vacuum chamber adapted for maintaining an internal pressure less than $1 \times 10^{-3}$ torr during sputtering, means for positioning a substrate of predetermined diameter to be processed in said vacuum chamber, and a sputtering target disposed opposite to said substrate in said vacuum chamber and having a sputtering surface with an outer periphery defining a diameter less than one and a half times the diameter of said substrate to be processed and including a raised area inclined toward the outer periphery of the sputtering surface of said target disposed opposite to said substrate, said sputtering surface having a center and the inclined area of said sputtering target being located at said center of said sputtering surface and terminating inwardly of said outer periphery.

* * * * *